Dec. 24, 1968 J. E. SOLOMON ET AL 3,418,592

DIRECT COUPLED AMPLIFIER WITH TEMPERATURE COMPENSATING MEANS

Filed Jan. 14, 1966

INVENTORS
James E. Solomon
George R. Wilson
BY
Mueller, Aichele & Rauner
ATTY'S.

3,418,592
DIRECT COUPLED AMPLIFIER WITH TEMPERATURE COMPENSATING MEANS

James E. Solomon, Phoenix, and George R. Wilson, Scottsdale, Ariz., assignors to Motorola, Inc., Franklin Park, Ill., a corporation of Illinois Filed Jan. 14, 1966, Ser. No. 520,577
3 Claims. (Cl. 330—23)

ABSTRACT OF THE DISCLOSURE

DC temperature compensation is provided in a direct coupled amplifier having a single power supply from a current source deriving current from the power supply supplying an offset voltage in a DC feedback circuit connecting the output circuit to the input circuit. The current source has a temperature-current characteristic compensating the temperature-current characteristics of the input circuit. Current from the source is also supplied through the output circuit means active element, such as a transistor.

Figure 1:
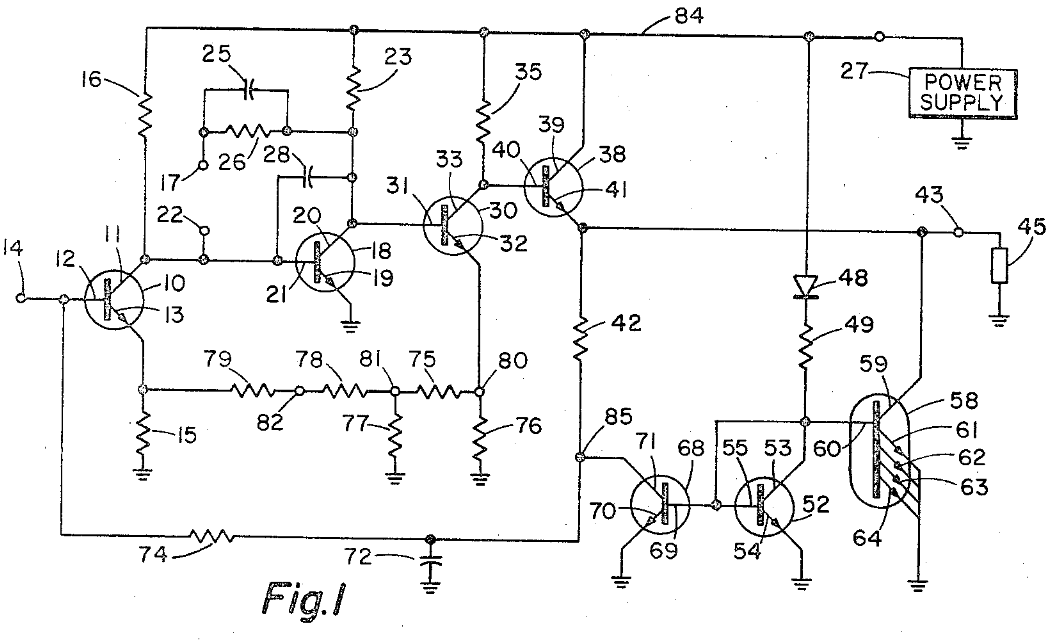

This invention relates to video amplifiers and in particular to a video amplifier feedback stabilization circuit especially adapted for integrated circuit construction.

In a multistage amplifier circuit, which is manufactured in a form of monolithic integrated circuit, it is desirable to minimize the use of capacitors as they are difficult or impossible to construct in an integrated circuit form. Therefore, in an integrated multistage amplifier it is necessary to couple the amplifier stages directly to reduce the number of capacitors used. The use of direct coupling introduces problems of direct current bias stability, particularly in high gain amplifiers. If a multistage amplifier is constructed without some form of direct current stabilization, a slight variation in the direct current bias at the input circuit will produce extremely large variations in the output direct current bias, thereby seriously degrading the circuit performance. In order to provide proper bias stabilization, direct current feedback is provided between the output stage and the input of the amplifier. By proper selection of the ratios of the circuit elements forming the feedback path, it is possible to establish the output direct current voltage level at a desired value which is stable under stable ambient temperature conditions.

Normally the direct current voltage level desired at the output of the amplifier is one-half of the supply voltage so that the output signal will have an equal swing in each direction. While resistor voltage divider direct current feedback techniques produce a stable operating point under stable ambient temperature conditions, it is difficult to maintain the desired operating point with severe changes in operating temperature. This is particularly true in military equipment where the temperature range over which operation is required may be from −55° C. to +125° C. In this case the stability of the amplifier output is dependent upon the stability of $V_{BE}$ of the input transistor where $V_{BE}$ is the direct current voltage drop between base and emitter. The $V_{BE}$ of the input transistor will change with temperature, increasing with increasing temperature from about 0.5 volt at −55° C. to about 1.0 volt at +125° C. This shift in $V_{BE}$ will cause a shift in the direct current output potential at the amplifier output. Because of the high gain of a multistage amplifier the small shift in $V_{BE}$ of the input transistor will be sufficient to bias the output transistor fully on or fully off depending upon the number of stages.

It is, therefore, an object of this invention to provide a feedback circuit for a direct coupled amplifier having improved temperature characteristics so that the operating point at the output of the amplifier will be maintained at a substantially constant direct current potential throughout a large temperature range.

A feature of this invention is the provision of a direct coupled amplifier circuit with a direct current feedback network incorporating a temperature dependent current supply to provide a current through an offset resistor in the feedback path. The current through the offset resistor develops an offset voltage to compensate for changes with temperature in the base-to-emitter voltages of the input transistor.

Figure 2:
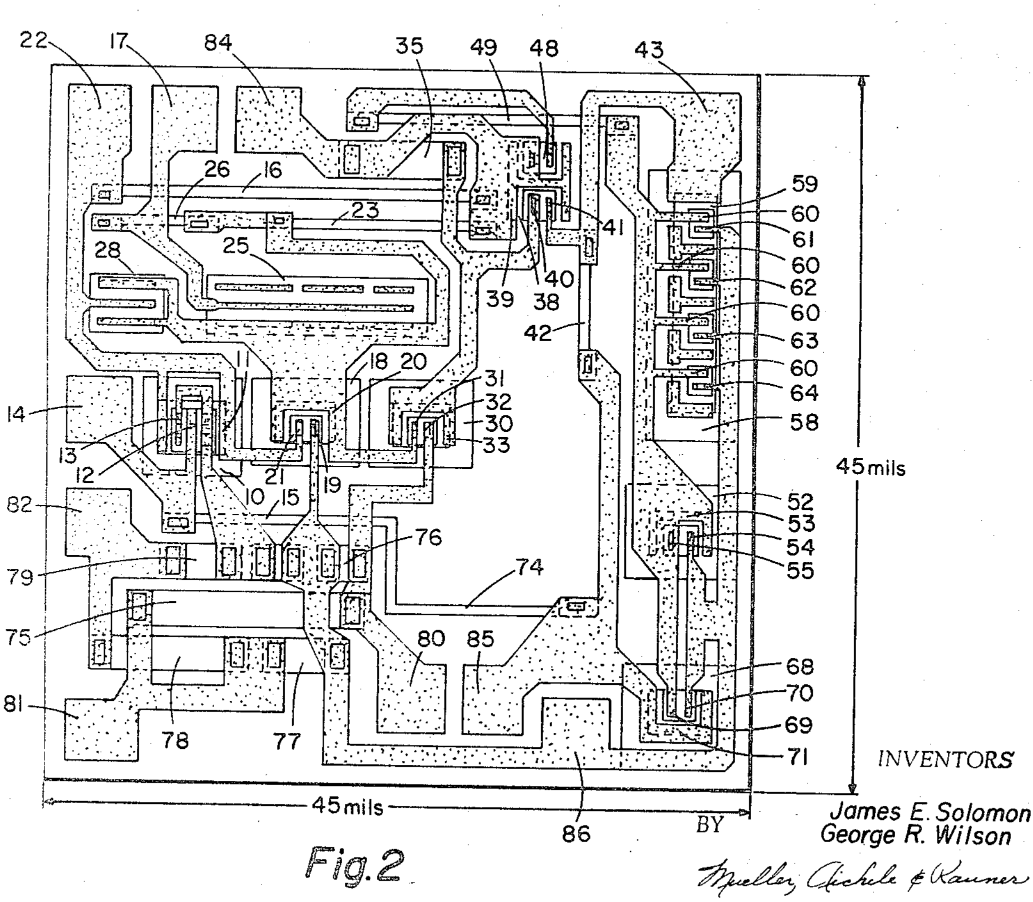

This invention is illustrated in the drawings of which:

FIG. 1 is a schematic of a circuit incorporating the features of this invention; and FIG. 2 is a drawing of a monolithic integrated circuit die incorporating the circuit of FIG. 1.

In practicing this invention a direct coupled semiconductor amplifier is provided in a form suitable for manufacture as an integrated circuit. Feedback networks are provided to achieve stability and in particular a direct current feedback network coupling the output of the amplifier to the input is provided to stabilize the output operating point. This feedback network includes a resistor across which an offset voltage is developed by a temperature dependent current supply. The current through the current supply changes with temperature so that the offset voltage developed across the offset resistor changes to compensate for changes with temperature in the base-emitter voltage of the input transistor. This compensation maintains the output operating point at a stable operating condition over a large temperature range.

Referring to FIG. 1 there is shown a video amplifier including an input transistor 10 having a base 12 coupled to input terminal 14. Input terminal 14 is adapted to receive a video signal which is to be amplified by the multistage video amplifier. Emitter 13 of transistor 10 is coupled to a reference potential by resistor 15 and collector 11 is coupled to power supply 27 by resistor 16. The output of transistor 10 is coupled from collector 11 to base 21 of transistor 18. Collector 20 of transistor 18 is coupled to power supply 27 by resistor 23 and emitter 19 of transistor 18 is coupled to the reference potential. In order to increase the bandwidth of the amplifier, a feedback circuit is provided from collector 20 to base 21 of transistor 18. This feedback circuit consists of capacitor 28 coupled between collector 20 and base 21 and capacitor 25 coupled in parallel with resistor 26 between collector 20 and terminal 17. Changes in the amount of feedback can be made by connecting terminal 17 to terminal 22.

The output of transistor 18 is coupled from collector 20 to base 31 of transistor 30. Collector 33 of transistor 30 is coupled to power supply 27 by resistor 35 and emitter 32 of transistor 30 is coupled to a reference potential by resistor 76. Resistors 75, 77, 78 and 79 provide a feedback circuit from emitter 32 of transistor 30 to emitter 13 of transistor 10. The direct current potentials of emitter 32 of transistor 30 and emitter 13 of transistor 10 are substantially the same so that little direct current flows between these two points through feedback resistors 75, 78 and 79. The impedance of the feedback path to alternating current can be changed by interconnecting terminals 80, 81 and 82 by external connectors. Since the direct current potentials at emitter 32 of transistor 30 and emitter 13 of transistor 10 are substantially the same, changing the alternating current feedback at this point will have little effect on the operating points of transistors 10 and 30. The output of transistor 30 is coupled from collector 33 to base 40 of transistor 38. Collector 39 of transistor 38 is coupled to power supply 27 and emitter 41 of transistor 38 is coupled to load 45 through output terminal 43.

A temperature dependent current source is provided consisting of diode 48, resistor 49 and transistor 52. Transistor 52 has collector 53 coupled to base 55 and emitter 54 coupled to the reference potential. The current flowing through transistor 52 develops a potential at base 55, which is a function of the emitter area and current flowing through transistor 52. A multiple emitter transistor 58 is provided having collector 59 coupled to output terminal 43 and base 60 coupled to collector 53 of transistor 52. The multiple emitters 61 to 64 are coupled to the reference potential. Transistor 58 provides a current source to supply energy to load 45. By using multiple emitters the emitter area of transistor 58 can be greater than the emitter area of transistor 52 and therefore the current flowing through transistor 58 will be greater than the current flowing through transistor 52 by the ratio of their emitter areas.

In order to prevent changes in the base 12 to emitter 13 voltage, $V_{BE}$, of transistor 10 from causing changes in the operating point of emitter 41 of transistor 38, a direct current feedback path is provided to stabilize the operating point of emitter 41. This feedback path consists of offset resistor 42 coupled between emitter 41 and collector 71 of transistor 68 and resistor 74 coupled to collector 71 of transistor 68 and base 12 of transistor 10. Emitter 70 of transistor 68 is coupled to a reference potential and base 69 of transistor 68 is coupled to base 55 of transistor 52. Capacitor 72, coupled to collector 71 of transistor 68, acts to bypass alternating current signals appearing at this point.

In operation, the potential across diode 48, resistor 49 and transistor 52 establishes a flow of current through transistor 52 which develops a voltage at base 55. The voltage at base 55 of transistor 52 is applied to base 69 of transistor 68 and acts to cause a current of substantially the same magnitude to flow through transistor 68. It is assumed that the emitter areas of transistor 68 and 52 are the same. The flow of current through transistor 68 develops an offset voltage across resistor 42 which is added to the voltage appearing at base 12 of transistor 10. The voltage drop across resistor 74 is negligible since the only current flowing through this resistance is the base current for transistor 10, and a portion of the current which would normally flow through transistor 68 provides this small base current. Thus, the flow of current through resistor 42, established by transistor 68, sets up an offset voltage across resistor 42 which establishes emitter 41 of transistor 38 at some potential higher than the potential on base 12 of transistor 10.

Assume that the ambient temperature increases and thus the voltage $V_{BE}$ of transistor 10 increases. Without the current source compensation, the increase in voltage at base 12 of transistor 10 would result in an increase in voltage at emitter 41 of transistor 38. However, the increase in temperature also causes an increase in the voltage drop across diode 48 and transistor 52 so that the current flow through these semiconductor devices is diminished. This decrease in the current flow through transistor 52 causes a decrease in the current flow through transistor 68 so that the voltage drop across offset resistor 42 decreases. The change is such that the decrease in the offset voltage across resistor 42 equals the increase in voltage at base 12 of transistor 10 so that the operating point of emitter 41 of transistor 38 remains at the same potential.

When the ambient temperature decreases, the potential at base 12 of transistor 10 also decreases while at the same time the current flow through transistor 52 increases. This causes the current through transistor 68 to increase, increasing the offset voltage developed across resistor 42 to that the potential at emitter 41 of transistor 38 remains constant.

The circuit of FIG. 1 is readily adaptable to manufacture in an integrated circuit form. FIG. 2 illustrates the construction of a monolithic integrated semiconductor die which incorporates the circuit of FIG. 1. The portions of the die of FIG. 2 corresponding to the circuit elements shown in the schematic of FIG. 1 have the same reference numerals. When formed in this manner, the die can be packaged in a standard integrated circuit package. Power supply 27 of FIG. 1 is connected to terminal 84 of FIG. 2. The input signal to the amplifier is connected to terminal 14 and load 45 of FIG. 1 is connected to terminal 43. Capacitor 72 of the schematic of FIG. 1 is too large to be formed conveniently as part of an integrated circuit die and, therefore, is an external capacitor which is connected to pad 85. Pad 86 is connected to a reference potential.

Thus a video amplifier has been provided which is direct coupled so that it may be readily formed in an integrated circuit die. The video amplifier has a temperature compensated direct current feedback circuit to prevent the changes in the output operating point with changes in the ambient temperature.

We claim:

1. A feedback stabilization circuit for a multistage direct coupled amplifier having input circuit means, output circuit means and a power supply, said feedback stabilization circuit including in combination, direct current feedback means including impedance means coupling the input circuit means to the output circuit means to maintain the direct current operating point of the output circuit means at a desired value, temperature sensitive current supply means coupled to the power supply and said impedance means intermediate said input and output circuit means to cause a first current derived from said power supply to flow through at least a portion of said impedance means and through the output circuit means, said temperature sensitive current supply means including first resistor means and first semiconductor means series coupled with the power supply whereby a second current having a magnitude proportional to the ambient temperature of said first semiconductor means is caused to flow therethrough, said first semiconductor means further having a first electrode at which an output potential is developed having a value proportional to said second current, said temperature sensitive current supply means further including second semiconductor means having an input electrode coupled to said impedance means, an output electrode coupled to the power supply and a control electrode coupled to said first electrode of said first semiconductor means, said second semiconductor means being responsive to said output potential to cause said first current to flow therethrough and through said portion of said impedance means, said first current having a magnitude proportional to the magnitude of said second current

2. The feedback stabilization circuit according to claim 1 in which said impedance means includes second resistance means coupling the output circuit means to said input electrode of said second semiconductor means whereby said first current is caused to flow therethrough, said impedance means further including third resistance means coupling the input circuit means to said second resistance means, and capacitance means coupled between said input electrode of said second semiconductor means and the power supply.

3. The feedback stabilization circuit according to claim 2 in which, said first semiconductor means includes a first transistor having a collector electrode connected to said first resistance means, a base electrode coupled to said collector electrode and an emitter electrode coupled to the power supply, and said second semiconductor means includes a second transistor having an emitter electrode coupled to the power supply, a base electrode coupled to said base electrode of said first transistor and a collector electrode coupled to said second and third resistance means and said capacitance means.

References Cited

UNITED STATES PATENTS 3,040,264 6/1962 Weidner ------------ 330—25

ROY LAKE, *Primary Examiner.*

L. J. DAHL, *Assistant Examiner.*

U.S. Cl. X.R.

330—24, 38